US006432778B1

(12) United States Patent
Lai et al.

(10) Patent No.: US 6,432,778 B1
(45) Date of Patent: Aug. 13, 2002

(54) METHOD OF FORMING A SYSTEM ON CHIP (SOC) WITH NITRIDE READ ONLY MEMORY (NROM)

(75) Inventors: Erh-Kun Lai, Tai-Chung Hsien; Ying-Tso Chen, Kao-Hsiung Hsien; Chien-Hung Liu, Taipei; Shyi-Shuh Pan, Kao-Hsiung; Shou-Wei Huang, Chi-Lung, all of (TW)

(73) Assignee: Macronix International Co. Ltd., Hsin-Chu (TW)

( * ) Notice: Subject to any disclaimer, the term of this patent is extended or adjusted under 35 U.S.C. 154(b) by 0 days.

(21) Appl. No.: 09/682,216

(22) Filed: Aug. 7, 2001

(51) Int. Cl.⁷ ............................................ H01L 21/8236
(52) U.S. Cl. ...................... 438/276; 438/287; 438/954; 438/128
(58) Field of Search ................................. 438/276, 302, 438/217, 262, 266, 287, 954, 128, 129

(56) References Cited

U.S. PATENT DOCUMENTS 6,117,730 A * 9/2000 Komori et al. .............. 438/258
6,140,187 A * 10/2000 Debusk et al. .............. 438/287

* cited by examiner

Primary Examiner—Keith Christianson
Assistant Examiner—Yennhu B. Huynh
(74) Attorney, Agent, or Firm—Winston Hsu (57) ABSTRACT

An ONO dielectric layer is formed on the surface of a substrate, and then a plurality of bit lines are formed in the substrate by utilizing a photolithography and an ion implantation process. Thereafter the ONO dielectric layer in the periphery area is removed and the threshold voltage of the periphery transistor is adjusted. After the ONO dielectric layer in the read only memory area is removed, and a buried drain oxide layer and a plurality of gate oxide layers are formed atop each bit line and the surface of each device respectively. Then each word line in the memory area and each gate of each periphery transistor in the periphery area is formed so as to simultaneously form at least a nitride read only memory in the nitride read only memory area and a high, low threshold voltage device in the read only memory area. Finally the threshold voltage of the high threshold voltage device is adjusted by utilizing a ROM code implantation process.

15 Claims, 12 Drawing Sheets

METHOD OF FORMING A SYSTEM ON CHIP (SOC) WITH NITRIDE READ ONLY MEMORY (NROM)

BACKGROUND OF INVENTION

1. Field of the Invention

The present invention provides a method of forming a system on chip(SOC), and more particularly, to a method of forming a system on chip embedded with nitride read only memory(NROM) and mask read only memory by utilizing nitride read only memory.

2. Description of the Prior Art

A Read only memory(ROM) device is a semiconductor device for data storage. It is composed of a plurality of memory cells and is widely applied in the data storage and memory system of computer nowadays. The read only memory can be classified into mask ROM, programmable ROM(PROM), erasable programmable ROM(EPROM), electrically erasable programmable ROM(EEPROM), nitride read only memory(NROM) and flash ROM according to the method for data storage. The main feature of read only memory is that once data or information is stored, it will not disappear because of an interruption or power cut, and so therefore the read only memory is also called non-volatile memory.

The character of nitride read only memory(NROM) is to utilize silicon nitride isolation dielectric layer as a charge trapping medium. Since the silicon nitride layer is extremely dense, hot electrons can tunnel into the silicon nitride layer and become trapped inside it through MOS transistor. This further forms an inhomogeneous density distribution in order to accelerate the rate of data reading and avoid leakage current. While the flash ROM utilizes a floating gate composed of polysilicon or metal to store charges, therefore it has an extra gate except the control gate. The former one has the advantage of a simple manufacturing process and low cost. Since the latter one needs to be made with a floating gate-inter-dielectric layer-control gate structure, and the quality of the material in the three-layer structure is very important, it is necessary to coordinate with an appropriate process and results in a more complex manufacturing process and higher cost.

In the modern electronics industry, it is often felt that the read only memory and the non-volatile memory need to exist in various products at the same time. In contrast to two devices manufactured in a single chip, the two devices manufactured in two separate chips will occupy more room and also raise the cost. Therefore in U.S. Pat. No. #5,403,764, Yamamoto et al. had proposed a method of implanting ROM code into the flash ROM device in the ROM region by utilizing an ion implantation process during flash ROM manufacturing process, or in other words, completing the "read" procedure, then completing the manufacturing process of the flash ROM. So the read only memory is established in some portion of the flash ROM chip.

Figure 1:
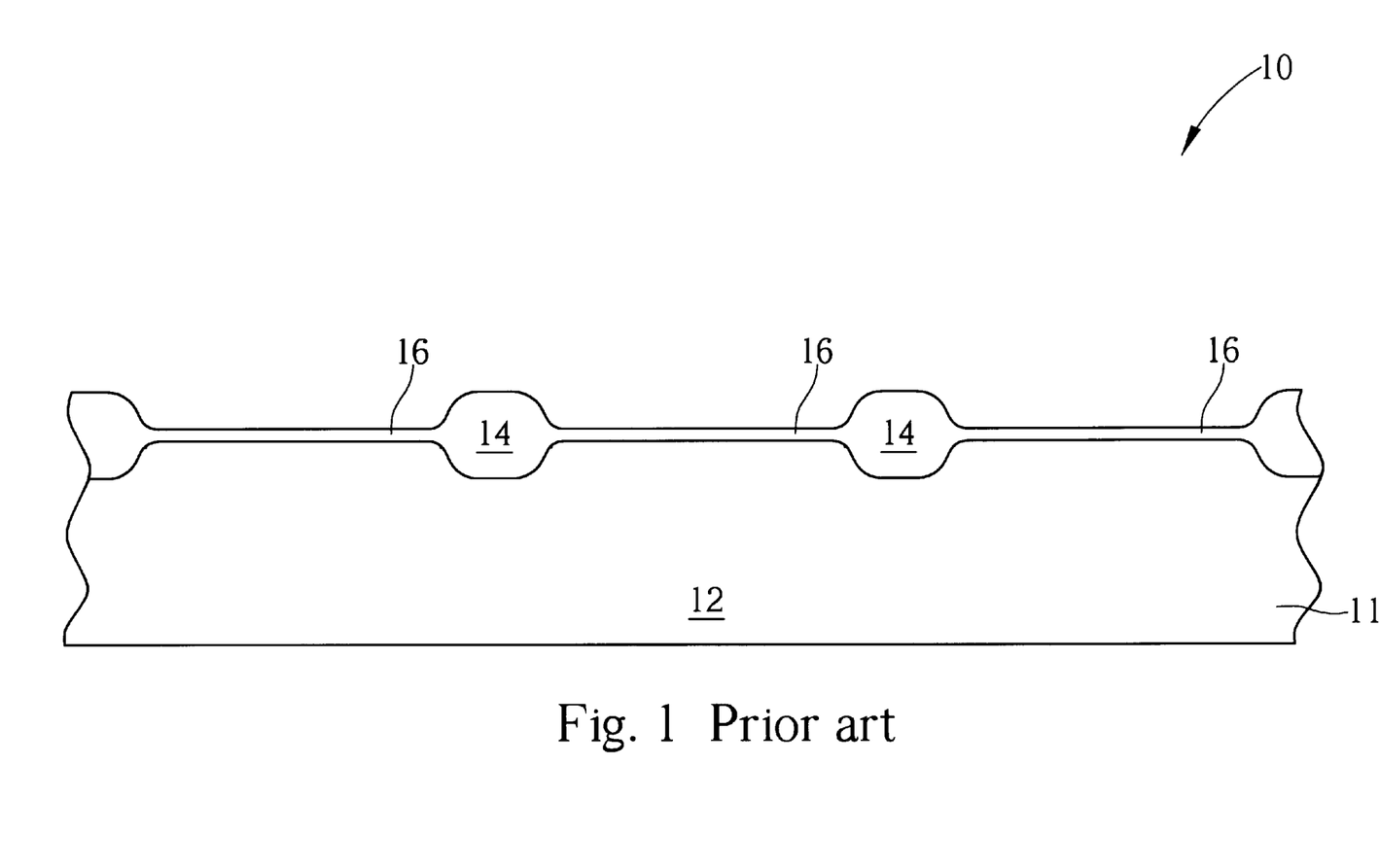
FIG. 1 to FIG. 5 are schematic diagrams of a process for making a flash ROM chip comprising read only memory according to the prior art.

Please refer to FIG. 1 to FIG. 5. FIG. 1 to FIG. 5 are schematic diagrams of a process for making the flash ROM chip 10 comprising read only memory 24 according to the prior art. As shown in FIG. 1, the prior art method of forming a flash ROM chip 10 comprising read only memory 24 is to first provide a semiconductor wafer 11 comprising P type silicon base 12, then utilize a thermal oxidation process with a temperature about 1100° C. and process time about 90 minutes to form a silicon dioxide ($SiO_2$) layer 14 with a thickness several thousands angstroms(Å) on the surface of the silicon base 12 not covered by the oxidation-protective film(not shown), such as silicon nitride($Si_3N_4$). After that the remaining silicon nitride layer (not shown) is removed and a very thin silicon oxide layer 16 is preserved between the silicon dioxide layer 14 and the silicon dioxide layer 14, that is, in between each field oxide layer. In other words,utilizing local oxidation(LOCOS) to form the isolation between each transistor completed afterwards.

Figure 2:
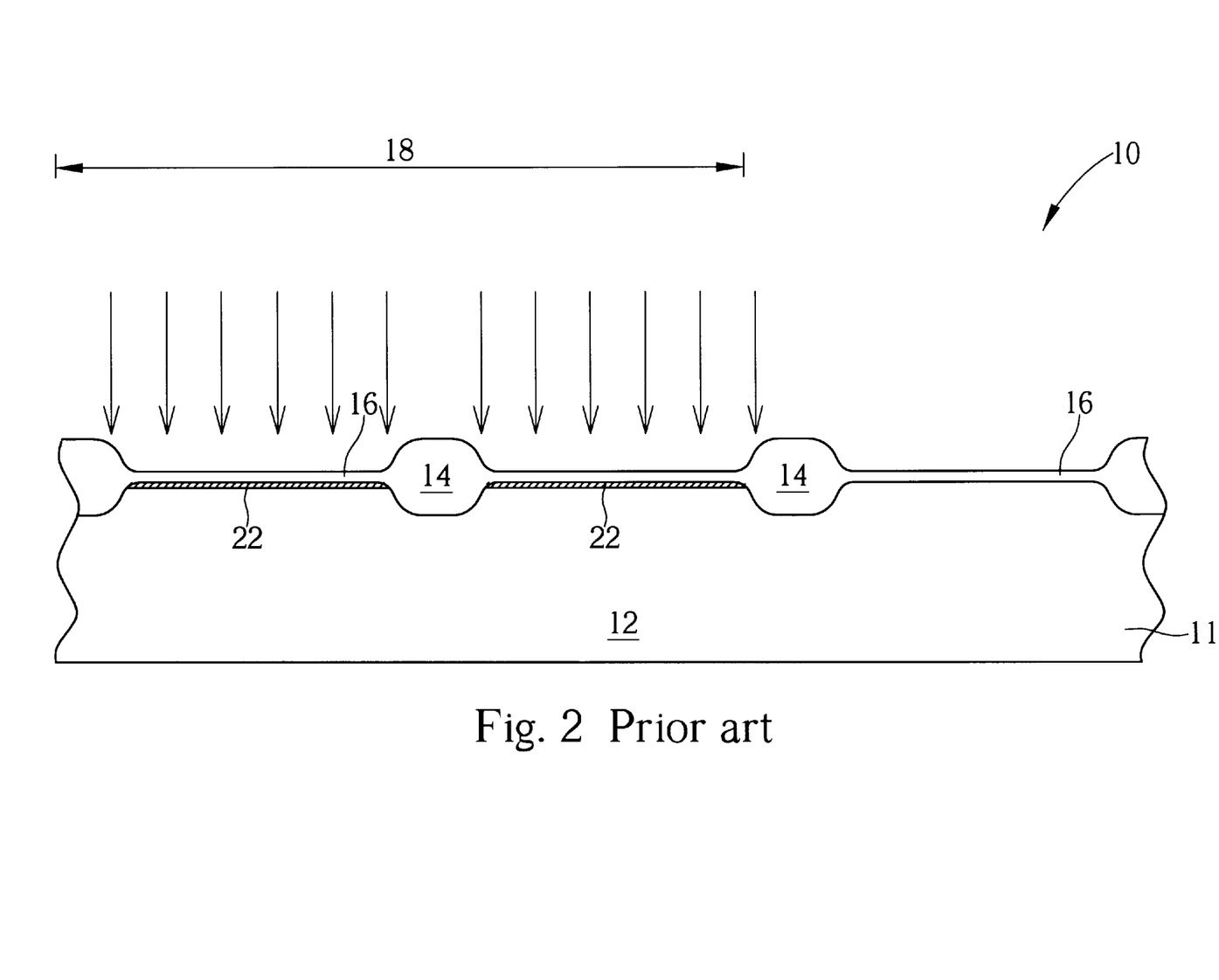

As shown in FIG. 2, an ion implantation process in the read only memory area 18 on the flash ROM chip 10 is performed. The ion implantation process utilizes an accelerating energy ranging from 40 to 50 keV, Boron ion dosage ranging from 1E12 to 3E12/cm$^2$ to form a first P+ type doping area 22 with ion concentration ranging from $10^{16}$ to $10^{17}$/cm$^3$. The objective of the ion implantation process is to adjust the threshold voltage(Vth) of the first read only memory(not shown) in the read only memory area 18 to a first specific value, so the threshold voltage of the first read only memory(not shown) is adjusted to around 1V and store a data "1".

Figure 3:
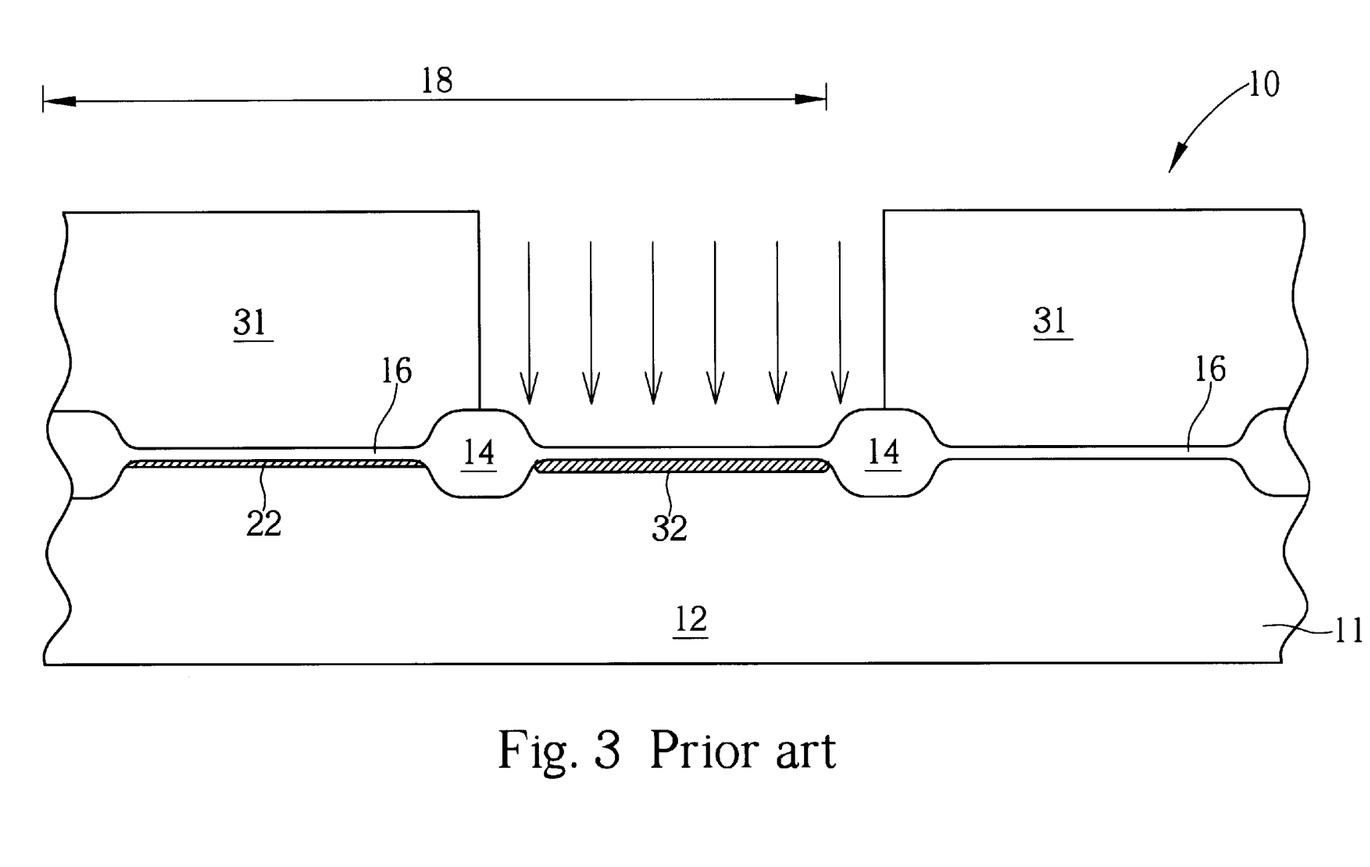

As shown in FIG. 3, a first photolithography process is performed in order to form a first mask 31 out of the read only memory area 18 and the read only memory 26 with a second specific value as its threshold voltage. Thereafter an ion implantation process is performed on the flash ROM chip 10, the ion implantation process utilizing the accelerating energy ranged from 40 to 50 keV, Boron ion dosage ranging from 5E12 to 1E13/cm$^2$ to form a second P+ type dopant area 32 with final ion concentration ranged from $10^{17}$ to $10^{18}$/cm$^3$. The objective of the ion implantation process is to adjust the threshold voltage(Vth) of the second read only memory(not shown) in the read only memory area 18 to a second specific value, so the threshold voltage of the second read only memory(not shown) is adjusted to around 7V and store a data "0".

Figure 4:
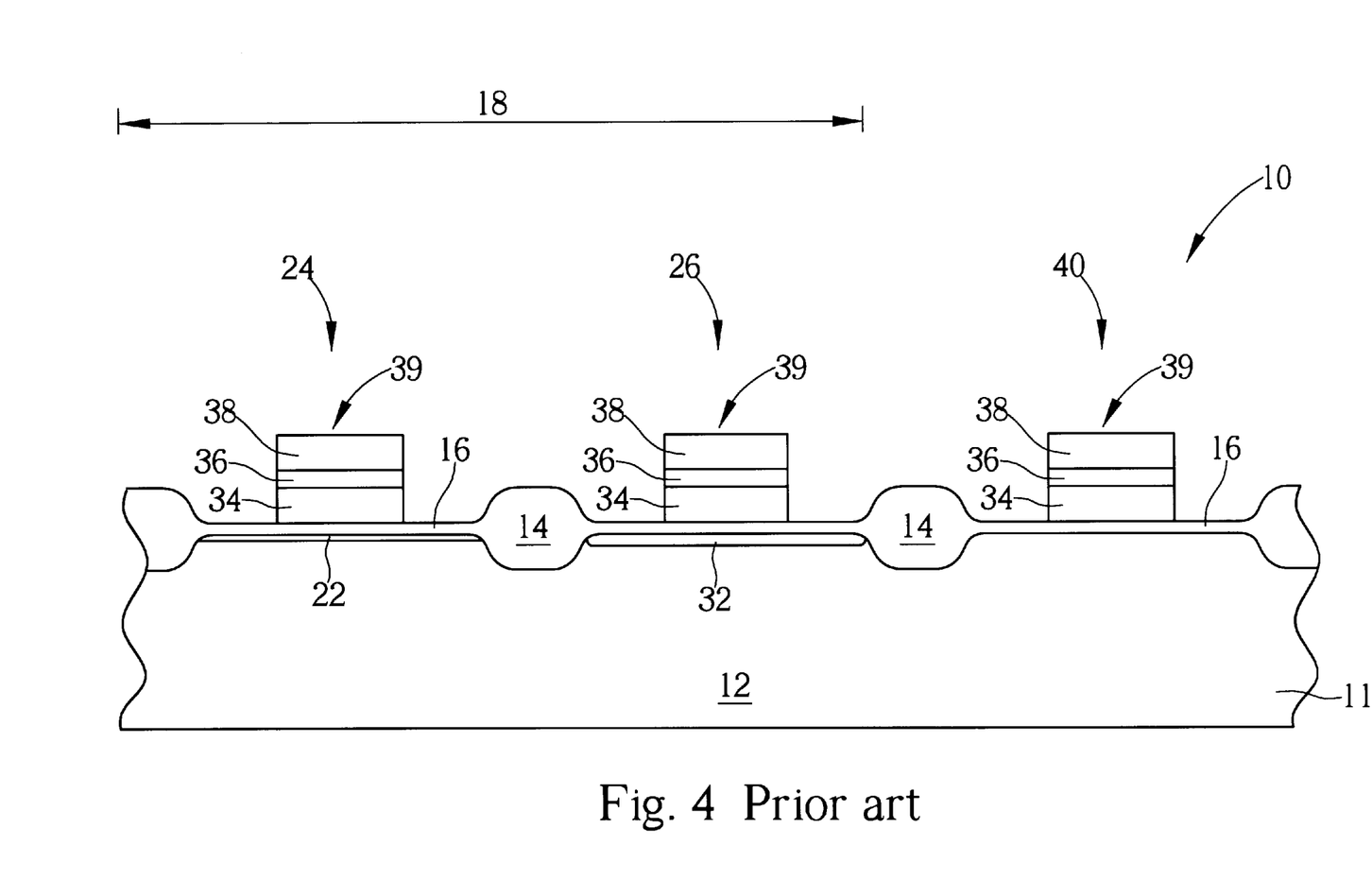

As shown in FIG. 4, a first polysilicon layer 34, an interlayer isolation layer 36 composed of silicon nitride or silicon oxide and a second polysilicon layer 38 on the flash ROM chip 10 are then deposited. After that a second photolithography process is performed in order to form a double gate 39 of the first read only memory 24, the second read only memory 26 and the flash ROM 40. Although the gate structure of the first, the second read only memory 24,26 is single layered in general and the double gate 39 with three layered structure is not required, all of the gates are completed with the same process steps in the prior art method in order to reduce the number of process steps.

Figure 5:
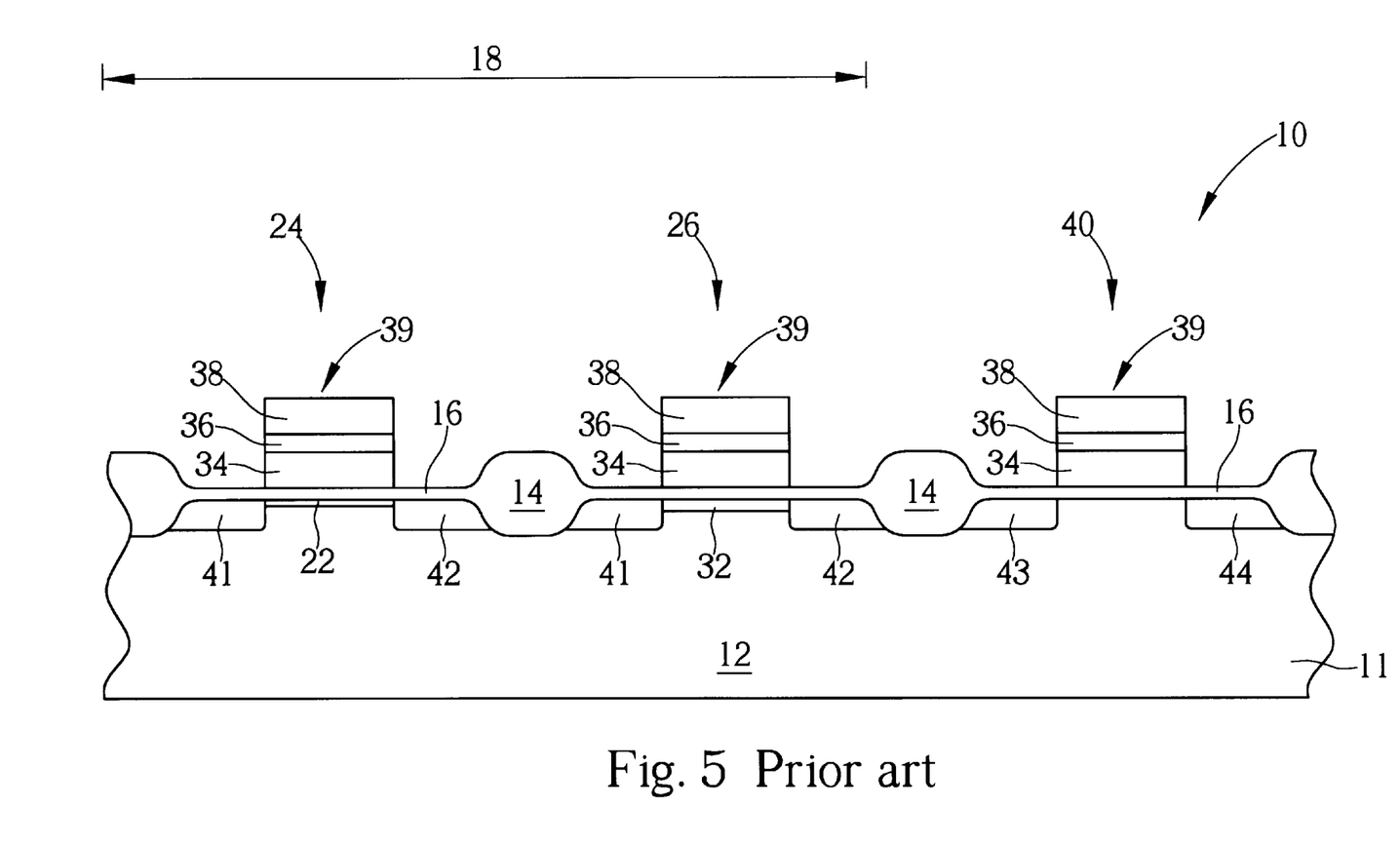

As shown in FIG. 5, a phosphorous ion implantation process is performed by utilizing a third mask(not shown) in order to form a N+ source 41, a N+ drain 42 at either side of the double gate 39 of the first, the second read only memory 24, 26 to complete the manufacturing of the first, the second read only memory 24, 26. Finally another phosphorous ion implantation process is performed by utilizing a fourth mask(not shown) in order to form a N+ source 43, a N+ drain 44 at either side of the double gate 39 of the flash ROM 40 to complete the manufacturing of the flash ROM 40. Therefore not only the read only memory 24, 26 on the flash ROM chip 10 are written with "0" or "1" but also the flash ROM 40 is completed by just adding two process steps for threshold voltage adjustment in the standard flash ROM manufacturing process.

However the flash ROM chip in the prior art only comprises some read only memory, the objective of system on chip is not achieved. Moreover the cost of flash ROM is more expensive, not suitable to the manufacturing of system on chip. Therefore it is very important to develop a system on chip to utilize the device with cheaper cost and its manufacturing process to simultaneously make the read only memory and the nitride read only memory on the same chip, and omit the electrical writing step for the general non-volatile memory after completion.

SUMMARY OF INVENTION

It is therefore a primary objective of the present invention to provide a method of forming a system on chip(SOC), and more particularly, to a method of forming a system on chip embedded with nitride read only memory and read only memory by utilizing nitride read only memory.

In the first preferred embodiment of the present invention, the system on chip is made on the surface of the semiconductor wafer and utilizes the manufacturing process of the nitride read only memory(NROM) to simultaneously make the read only memory and the nitride read only memory. The method according to the present invention comprises forming an ONO dielectric layer on the surface of the substrate, forming a plurality of N type dopant implantation areas and each bit line in the substrate by utilizing a first photolithography and a first ion implantation process, etching and removing the ONO dielectric layer in the periphery area and performing a second ion implantation process so as to adjust the threshold voltage of the transistor in the periphery area, and performing a third etching process to remove the ONO dielectric layer in the read only memory area. After that a thermal oxidation process is performed so as to form a buried drain oxide layer atop each bit line, and a gate oxide layer of the low threshold voltage device and the high threshold voltage device in the read only memory area and a gate oxide layer of the periphery transistor in the periphery area. To utilize a second photolithography and a fourth etching process so as to simultaneously form each word line in the memory area and each gate of the periphery transistor in the periphery area. At least one nitride read only memory is formed in the nitride read only memory area, a low threshold voltage device in the low threshold voltage device area and a high threshold voltage device in the high threshold voltage device area in the read only memory area are respectively formed. The threshold voltage of the high threshold voltage device is adjusted by utilizing a third ion implantation process. Since there are both high threshold voltage devices and low threshold voltage devices existing in the read only memory area, they can be used as read only memory. Therefore the system on chip not only comprises periphery transistors but also comprises read only memory and nitride read only memory.

It is an advantage of the present invention to utilize nitride read only memory and added ion implantation process to simultaneously make the read only memory and the nitride read only memory on a system on chip. Therefore not only the time and manpower exhausted by electrical writing, which leads to mass production unfeasibility, generally required after completing the non-volatile memory can be avoided, but also the low cost system on chip can be fabricated by keeping the process flow simple.

These and other objectives of the present invention will no doubt become obvious to those of ordinary skill in the art after having read the following detailed description of the preferred embodiment that is illustrated in the various figures and drawings.

Figure 6:
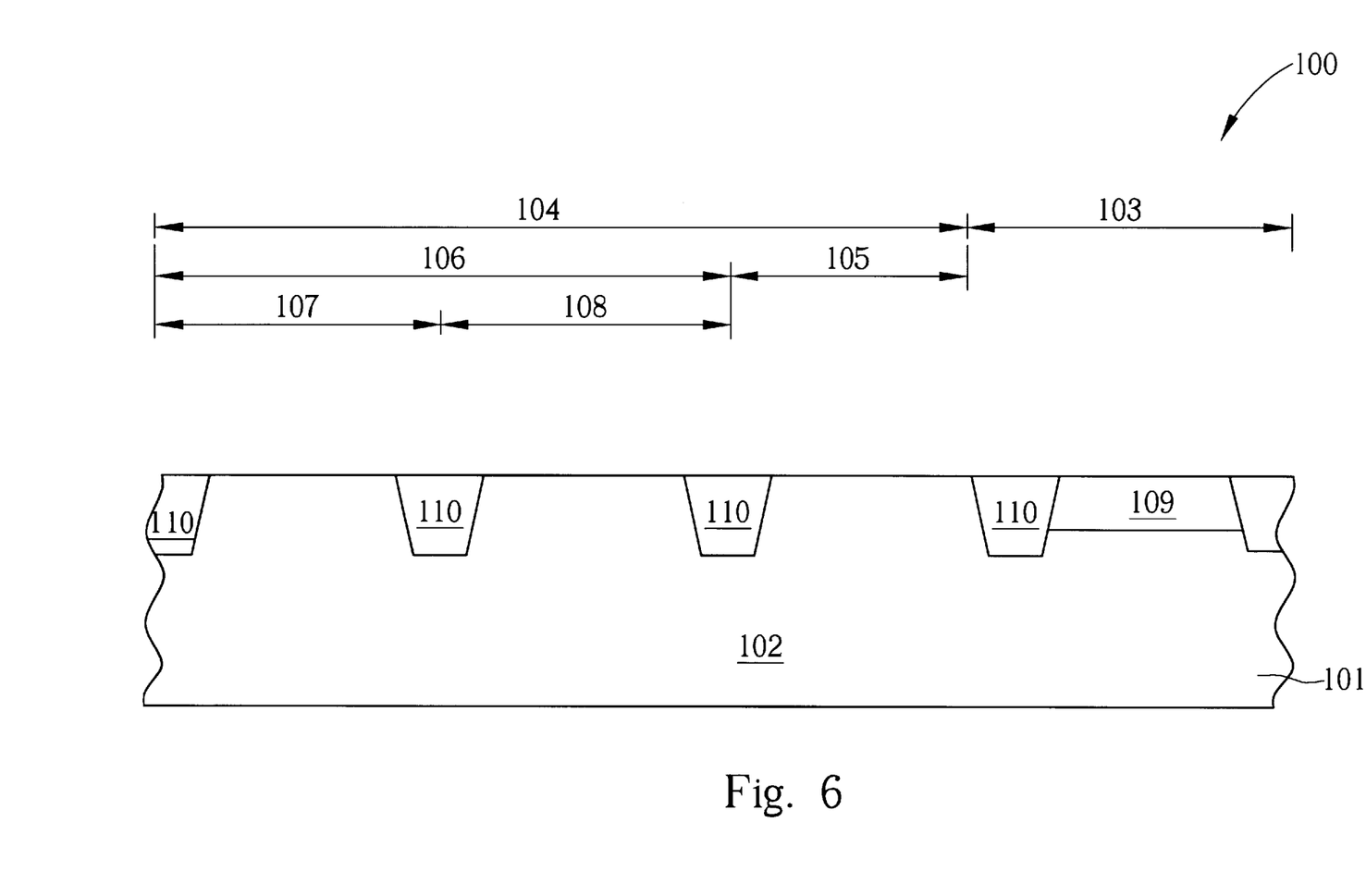
FIG. 6 to FIG. 12 are schematic diagrams of a process for forming a system on chip embedded with nitride read only memory and mask read only memory according to the present invention.
Figure 10:
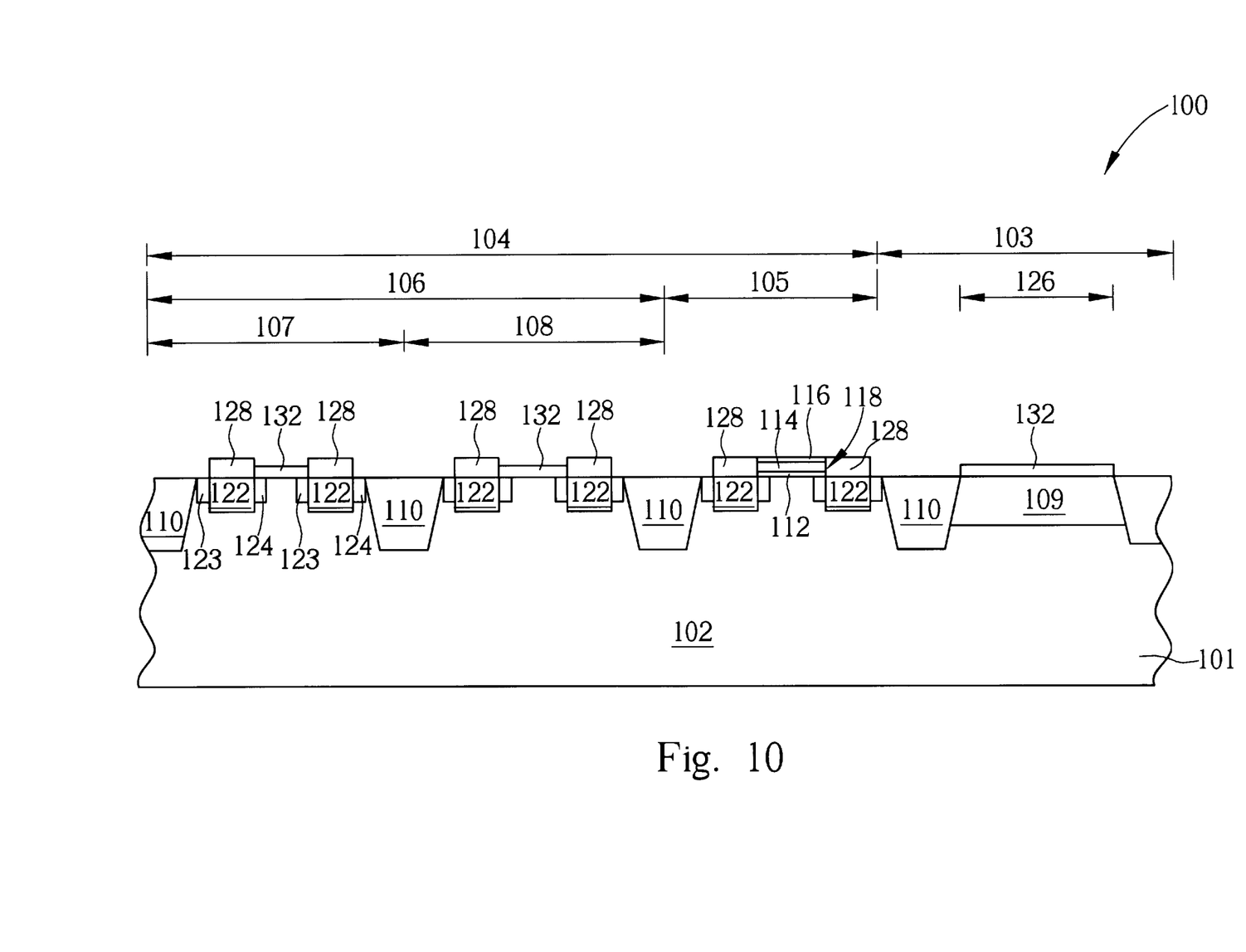
Figure 11:
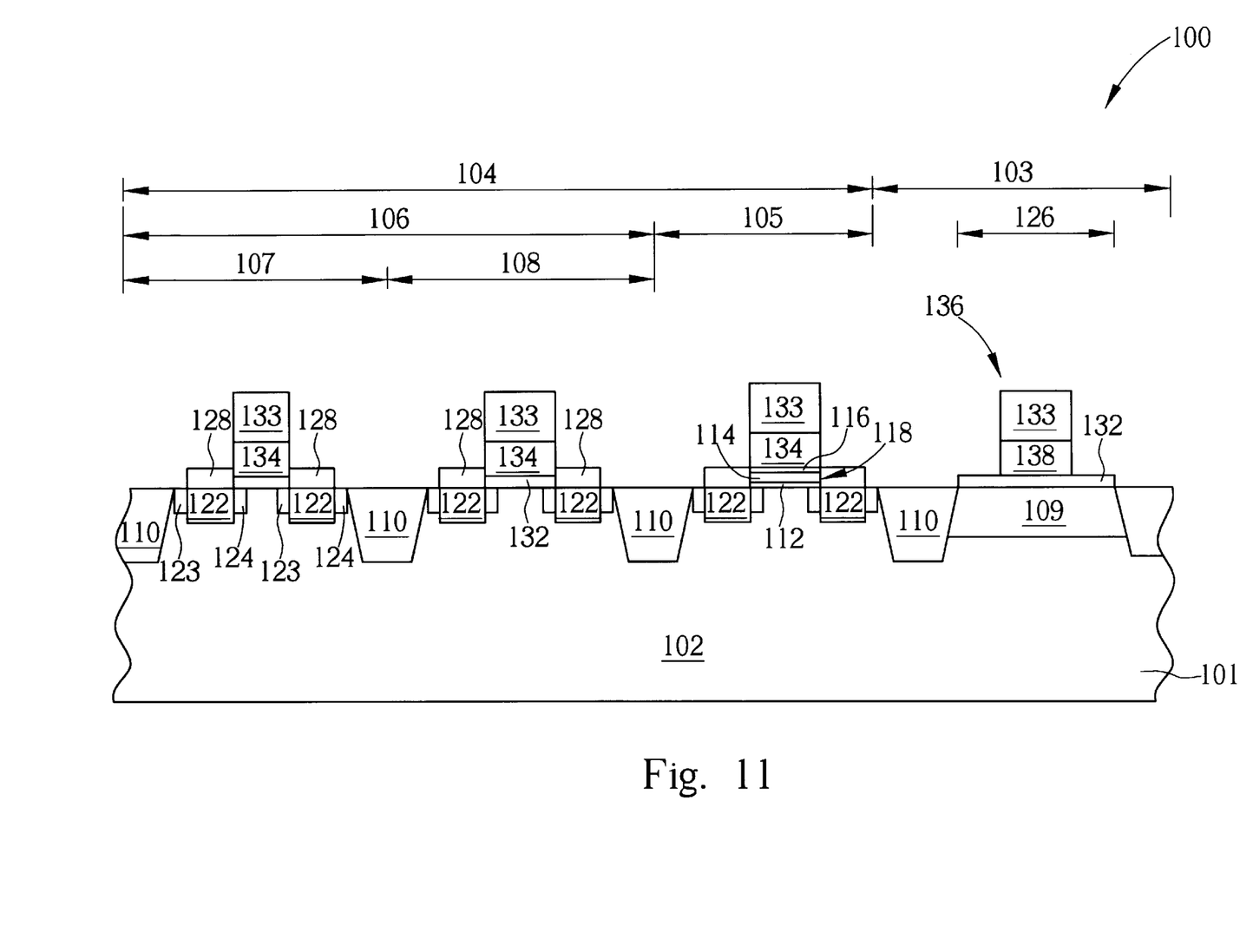
Figure 12:
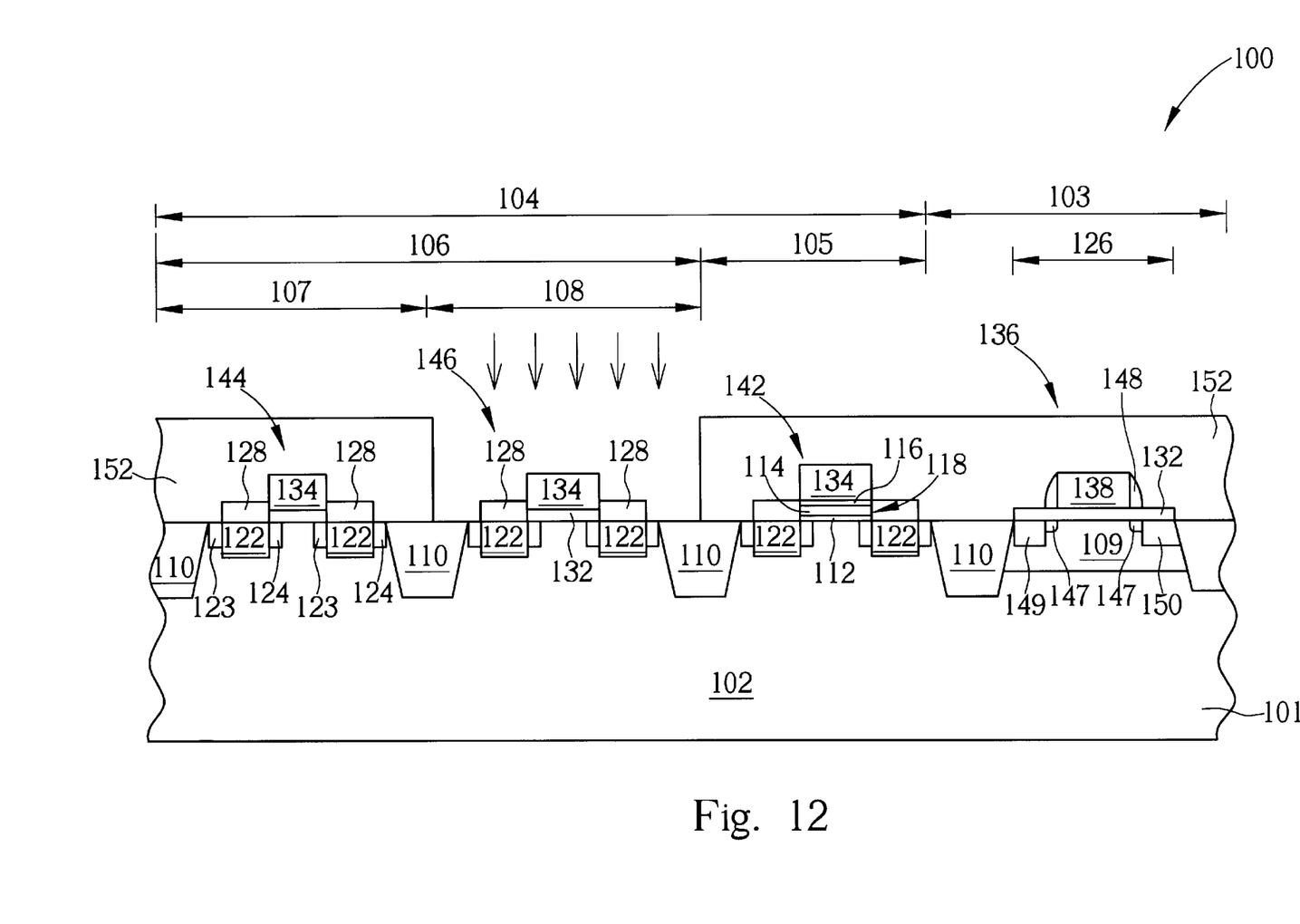

DETAILED DESCRIPTION refer to FIG. 6 to FIG. 12. FIG. 16 to FIG. 12 are schematic diagrams of a process for forming a system on chip 100 embedded with nitride read only memory and mask read only memory according to the present invention. As shown in FIG. 6, the method for forming the system on chip 100 according to the present invention is to provide a semiconductor wafer 101 comprising a P type silicon substrate 102 first, the surface of the semiconductor wafer 101 comprising a periphery area 103 and a memory area 104. The periphery area 103 comprises at least one high voltage transistor(not shown), at least one low voltage transistor, a capacitor(not shown) and a resistor (not shown) etc. The memory area 104 comprises a nitride read only memory area 105 and a read only memory area 106, and the read only memory area 106 further comprises at least one low threshold voltage(low Vt) device area 107 and at least one high threshold voltage(high Vt) device area 108. In the present invention, since the devices in the periphery area 103 are not the point of the emphasis, all of the description is given in broad outline. In the illustration of figures, only a high volt periphery transistor is used as representation.

Firstly some processes are performed in the periphery area 103. n N type ion implantation process and a P type ion implantation process are utilized in order to form the N type well(not shown) and the P type well(not shown) for the high volt transistor device(not shown) in the periphery area 103. For the convenience of illustration, a well 109 is only shown in the present invention. Then a plurality of isolators on the surface of the substrate 102 are formed in order to isolate the periphery area 103, the nitride read only area 105 and the read only memory area 106 respectively, and define the active area of each device. The isolator can be a shallow trench isolation area or a field oxide layer. A shallow trench isolation area 110 is used as illustrationsin the figures. Finally all of the pad oxide layers(not shown) are removed.

Figure 7:
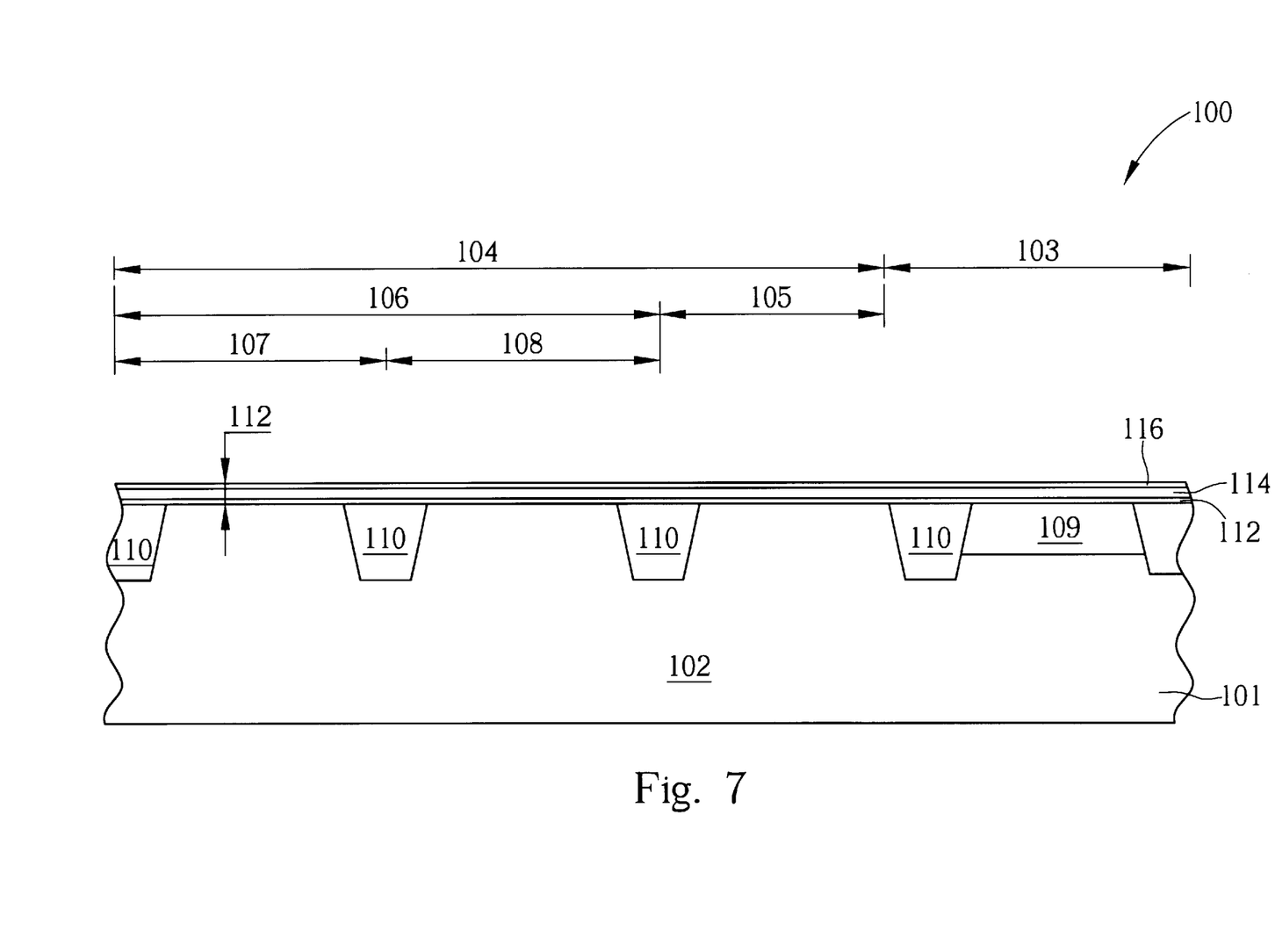

As shown in FIG. 7, thereafter a low temperature oxidation process with temperature ranging from 750° C.~1000° C. to form an oxide layer with a thickness ranging from 50~150 angstroms(Å) on the surface of the silicon substrate 102 for using as a bottom oxide layer 112. Then a low pressure chemical vapor deposition (LPCVD) process is performed in order to form a silicon nitride layer 114 with a thickness ranging from 100~300 angstroms atop the bottom oxide layer 112 for use as a charge trapping layer. Finally an annealing process at 950° C. for 30 minutes is performed to recover the structure of the silicon nitride layer 114, and a wet oxidation process is performed by inputting water vapor in order to form a silicon oxy-nitride layer with a thickness of 50~200 angstroms atop the silicon nitride layer 114 for using as a top oxide layer 116. During the growth process of the top oxide layer 116, approximate 25~100 angstroms of silicon nitride layer 114 will be consumed. The bottom oxide layer 112, the silicon nitride layer 114 and the top oxide layer 116 formed atop the silicon substrate 102 is called as ONO dielectric layer 118.

Figure 8:
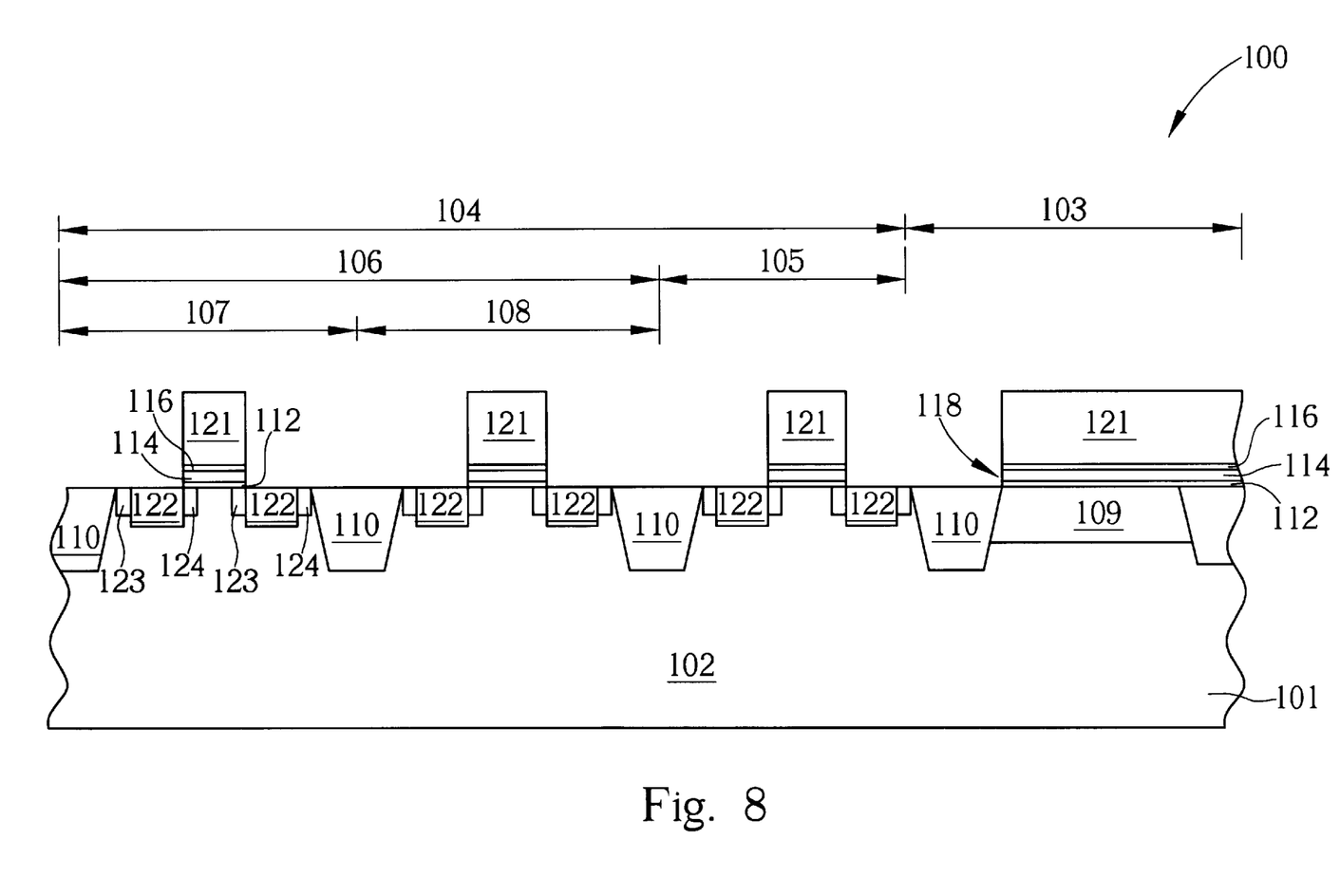

Then as shown in FIG. 8, a first photoresist layer 121 atop the ONO dielectric layer 118 is form, and a fist photolithography and etching process are performed in order to form a predefined pattern in the first photoresist layer 121 for defining the sites of bit lines. Thereafter a dry etching process is preformed in order to remove the top oxide layer 116, the silicon nitride layer 114 and the bottom oxide layer 112 not covered by the first photoresist layer 121, or in other words, all of the ONO dielectric layer 118. Or removing the top oxide layer 116, the silicon nitride layer 114 not covered by the first photoresist layer 121, and etch the bottom oxide layer 112 not covered by the first photoresist layer 121 to a predetermined thickness by utilizing the first photoresist layer 121 as mask. After that an ion implantation process is performed with an arsenic dosage ranging from 2~4 E15/cm$^2$ and an energy approximately 50 keV in order to form a plurality of N+ doping areas in the silicon substrate 102 for use as the bit lines 122 of memory cells. The bit lines 122 are also called buried drains, each two neighboring doping areas define a channel and the distance between the two neighboring doping areas is the channel length.

After that an angled ion implantation process is performed in order to form a P$^-$ type pocket doping area 123 at one side of each bit line 122. Then another angled ion implantation process is performed in order to form a P$^-$ type pocket doping area 124 at another side of each bit line 122. These two angled ion implantation process have about the same parameters except for the incident direction. The two angled ion implantation process utilize BF$^{2+}$ as a dopant, the dosage is approximately 1E13 to 1E15 ions/cm$^2$, the implantation energy is 20 to 150 KeV, the incident angle to silicon substrate 102 is approximately 20 to 45°. The two angled ion implantation process can be performed prior to the ion implantation process for forming the bit line 122. Under this process condition, the highest concentration for the BF$^{2+}$ dopants implanted into the silicon substrate 102 is located in the silicon substrate 102 underneath the channel with a depth approximately 1000 angstroms, and the horizontal distance implanted underneath the channel ranges from several hundreds to 1000 angstroms approximately. The objective for forming a P$^-$ type pocket doping area 123, 124 is to provide a high electric field area at one side of the channel, the high electric field area enhancing the hot carriers effect, improving the velocity when passing through channel under programming. In other words, accelerating the electrons in order to make more electrons acquire enough dynamic energy by way of collision or scattering effect to tunnel through bottom oxide layer 112 and penetrate into the silicon nitride layer 114 and further improve the writing efficiency.

Figure 9:
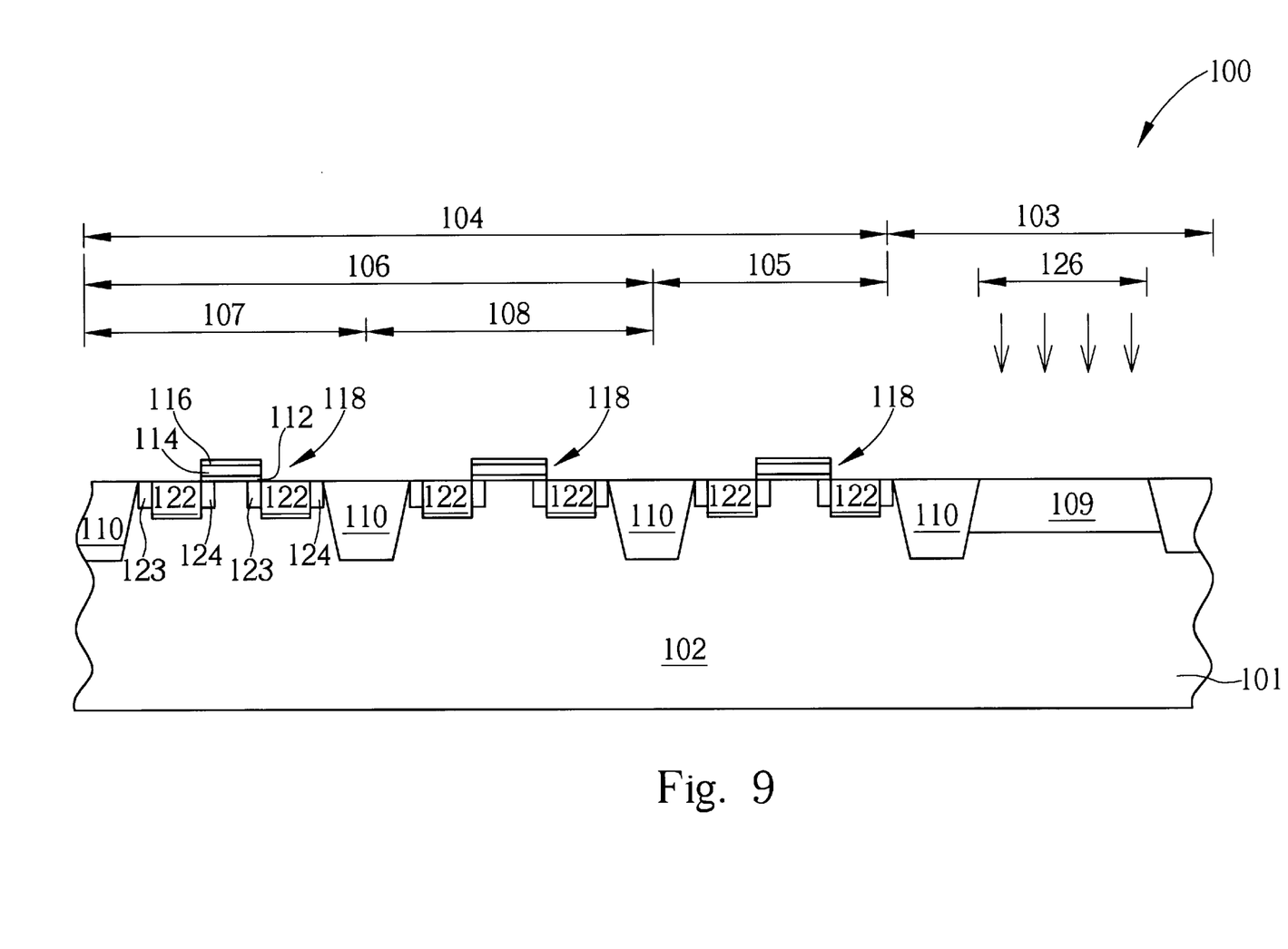

As shown in FIG. 9, the first photoresist layer 121 is removed. Then a second dry etching process is performed on the system on chip 100 in order to remove the ONO dielectric layer 118 in the periphery area 103. Thereafter a first ion implantation process is performed by utilizing a photoresist layer(not shown) as a mask, in order to perform an ion implantation process to the active area 126 of the periphery transistor (not shown) for threshold voltage adjustment. The pre-mentioned N type ion implantation process and P type ion implantation process for forming the N well(not shown) and the P well(not shown) of the high volt transistor device(not shown) in the periphery area can be performed prior to the first ion implantation process.

As shown in FIG. 10, a third etching process is performed in order to remove the ONO dielectric layer 118 in the read only memory area 106, and a cleaning process is performed on the read only memory area 106 and the periphery area 103. The objective of this step is to form a gate oxide layer instead of the ONO dielectric layer 118 in the subsequent process. Then a thermal oxidation process is performed in order to form a buried drain oxide layer 128 atop each bit lines 122, and to activate the dopants in each bit line 122 by using the thermal energy from the high temperature of the buried drain oxidation process. Furthermore, the thermal oxidation process simultaneously forms a gate oxide layer 132 with a thickness ranging from 100 to 250 angstroms on the surface of the semiconductor wafer 101 not covered by the ONO dielectric layer 118. The gate oxide layer 132 does not grow in the memory area 104 on the semiconductor wafer 101 with the existence of the ONO dielectric layer 118. In other words, the gate oxide layer 132 of the low threshold voltage device(not shown), the high threshold voltage device(not shown) in the read only memory area 106 and the gate oxide layer 132 of the periphery transistor(not shown) in the periphery area 103 are formed in the thermal oxidation process respectively.

It is worth mentioning that after the above process, a plurality of N type wells, P type wells, ion implantation processes and a plurality of repeated cleaning, etching and thermal oxidation process can be added in order to form the periphery transistor (not shown) with different voltage levels in the periphery area 103. As shown in FIG. 11, after that a polysilicon layer(not shown) or a polysilicon layer comprising a polysilicide layer on top is deposited on the surface of the ONO dielectric layer 118, the buried drain oxide layer 128 and the gate oxide layer 132. Then a second photolithography process is performed to form a second photoresist layer 133 on the surface of the polysilicon layer in order to define the sites of word lines in the memory area 104 and the sites of the gate of each periphery transistor in the periphery area 103.

Thereafter a fourth dry etching process is performed to remove the polysilicon layer not covered by the second photoresist layer 133 in order to simultaneously form the word lines 134 in the memory area 104 and the gate 138 of the periphery transistors 136 in the periphery area 103. Finally the second photoresist layer 133 is removed and at least one nitride read only memory 142 in the nitride read only memory area 105, a low threshold voltage device 144 and a high threshold voltage device 146 in the low threshold voltage (low Vt) device area 107 and a high threshold voltage(high Vt) device area 108 in the read only memory area 106 are formed respectively.

As shown in FIG. 12, following some process steps are preformed in order to complete the unfinished process steps for the periphery transistors 136 in the periphery area 103 on the system on chip, such as the lightly doped drain(LDD) 147, the spacer 148 and the source/drain(S/D) 149, 150. Then a third photoresist layer 152 is utilized to cover the low threshold voltage(low Vth) area 107 in the read only memory area 106 and the whole periphery area 103 and the nitride read only memory area 105, and another threshold voltage adjustment ion implantation process is performed in order to implant P type dopants into the high threshold voltage(high Vth) area 108 inside the read only memory area 106. This process step is also known as the ROM code implantation process for adjusting the threshold voltage of the high threshold voltage device 146 in the read only memory area 106. Finally the third photoresist layer 152 is removed. The third photoresist layer 152 can either cover the buried drain 128 or expose the buried drain 128.

Since there is a high threshold voltage device 146 and a low threshold voltage device 144 in the read only memory area 106, that can represent 0&1 or 1&0 respectively in order to achieve the objective of information or data storage when the chip is operating. After completing the ROM code implantation, manufacturing of the inter-metal dielectric (ILD, not shown), the metal layer(not shown), the contact hole(not shown) and the contact plug(not shown) on the system on chip 100 are completed to complete the system on chip 100. The system on chip 100 not only comprises some periphery transistors 136 in the periphery circuits, but also comprises read only memory and nitride read only memory.

The method of forming the system on chip in the present invention utilizes the nitride read only memory and the added ion implantation process to simultaneously form the read only memory and the nitride read only memory on the same chip. Therefore not only time and manpower exhausted by electrical writing, which leads to the mass production unfeasibility, generally required after completing the non-volatile memory is avoided, but also the process flow for the nitride read only memory is simple, its cost is about the same as the mask read only memory and its function is compatible to the flash ROM. This makes the system on chip embedded with read only memory and nitride read only memory by utilizing nitride read only memory cheaper and gives a more simplified manufacturing process compared to the prior art.

Compared to the prior art method of forming the flash ROM chip comprising read only memory, the present invention utilizes the nitride read only memory and added ion implantation process to simultaneously form the read only memory and the nitride read only memory on the same chip. Therefore not only the time and manpower exhausted by electrical writing, which leads to the mass production unfeasibility, generally required after completing the non-volatile memory can be avoided, but the cost is decreased greatly and the manufacturing process can be simplified obviously under the premise of function compatibility to the flash ROM.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of forming a system on chip (SOC) comprising read only memory (ROM) and nitride read only memory(NROM) established with nitride read only memory, the SOC comprising a substrate having a memory area and a periphery area, the memory area comprising a nitride read only memory area and a read only memory area, the read only memory area comprising a low threshold voltage (low Vt) device area and a high threshold voltage (high Vt) device area, the method comprising:

forming a plurality of isolators on the surface of the substrate to isolate the periphery area, the nitride read only memory area and the read only memory area, and to define an active area of each device;

forming an ONO (bottom oxide-nitride-top oxide) dielectric layer composed of a bottom oxide layer, a silicon nitride layer, and a top oxide layer, the ONO dielectric layer disposed on the surface of the substrate;

forming a first photoresist layer on the ONO dielectric layer and performing a first photolithography process to define a plurality of bit lines;

performing a first etching process utilizing the first photoresist layer as a mask to remove the ONO dielectric layer not covered by the first photoresist layer;

performing a first ion implantation process to form a plurality of N-type dopant areas in the substrate and form each bit line in the memory area;

removing the first photoresist layer;

performing a second etching process to remove the ONO dielectric layer in the periphery area;

performing a second ion implantation process to adjust a threshold voltage of a transistor in the periphery area;

performing a third etching process to remove the ONO dielectric layer in the read only memory area;

performing a thermal oxidation process to form a buried drain oxide layer atop each bit line, and to form a gate oxide layer for the low threshold voltage device, for the high threshold voltage device in the read only memory area, and for the periphery transistor in the periphery area;

forming a polysilicon layer and a second photoresist layer to define a plurality of word lines in the memory area and a plurality of gates of periphery transistors in the periphery area by utilizing a second photolithography process;

performing a fourth etching process to remove the polysilicon layer not covered by the second photoresist layer and to simultaneously form each word line in the memory area, the gate of each periphery transistor in the periphery area and at least one nitride read only memory in the nitride read only memory area, and to form a low threshold voltage (low Vth) device in the low threshold voltage device area and a high threshold voltage (high Vth) device in the high threshold voltage device area;

performing a third ion implantation process to adjust a threshold voltage of the high threshold voltage device; and removing the second photoresist layer.

2. The method of claim 1 wherein the substrate is a silicon substrate.

3. The method of claim 1 wherein the bottom oxide layer is formed by utilizing a low temperature oxidation process with a temperature ranging from 750° C. to 1000° C., and the bottom oxide layer has a thickness of 50 to 150 angstroms (Å).

4. The method of claim 1 wherein the silicon nitride layer is formed by utilizing a low pressure chemical vapor deposition (LPCVD) process for the floating gate of the nitride read only memory, and the bottom oxide layer has a thickness of 100 to 300 angstroms (Å).

5. The method of claim 1 wherein the top oxide layer is formed by utilizing a wet oxidation process, and the top oxide layer has a thickness of 50 to 200 angstroms (Å).

6. The method of claim 1 further comprising a fourth ion implantation process to form a plurality of wells in the periphery area.

7. The method of claim 6 wherein the fourth ion implantation process is performed prior to forming the ONO dielectric layer.

8. The method of claim 6 wherein the fourth ion implantation process is performed prior to the second ion implantation process.

9. The method of claim 1 further comprising a first angled ion implantation process and a second angled ion implantation process to form a P-type pocket dopant area at either side of each bit line.

10. The method of claim 9 wherein the first and the second angled ion implantation processes are performed prior to the first ion implantation process.

11. The method of claim 9 wherein the first and the second angled ion implantation processes are performed after the first ion implantation process.

12. The method of claim 1 wherein the third ion implantation process for adjusting the threshold voltage of the high threshold voltage device comprises:

performing a fourth photolithography process to form a patterned fourth photoresist layer, the fourth photoresist layer covering the low threshold voltage (low Vth) device in the read only memory area, the nitride read only memory area, and the periphery area;

implanting P-dopants into the high threshold voltage device to adjust the threshold voltage of the high threshold voltage device and complete a ROM code implantation process; and removing the fourth photoresist layer.

13. The method of claim 1 wherein a polysilicide layer is formed on the surface of the polysilicon layer.

14. The method of claim 1 wherein the high threshold voltage device and the low threshold voltage represent digital values of 0 and 1, or 1 and 0, respectively, to store data.

15. The method of claim 1 wherein the read only memory area is a mask ROM (MROM) area.

* * * * *